United States Patent [19]

Pappas

[11] Patent Number: 4,658,406
[45] Date of Patent: Apr. 14, 1987

[54] DIGITAL FREQUENCY DIVIDER OR SYNTHESIZER AND APPLICATIONS THEREOF

[76] Inventor: Andreas Pappas, 8 Avon Dr., Freehold, N.J. 07728

[21] Appl. No.: 764,368

[22] Filed: Aug. 12, 1985

[51] Int. Cl.$^4$ .......................... H03L 7/00; H03K 21/08
[52] U.S. Cl. .......................................... 377/48; 377/49; 377/56; 377/114; 364/734
[58] Field of Search ................ 377/47, 48, 49, 56, 377/114; 364/718, 734; 331/47, 48, 49, 51; 332/21

[56] References Cited

U.S. PATENT DOCUMENTS

| | | | |
|---|---|---|---|
| 3,430,067 | 2/1969 | Baum | 331/51 |
| 3,818,354 | 6/1974 | Tomisawa | 377/48 |
| 3,943,460 | 3/1976 | Arai | 331/51 |
| 4,041,403 | 8/1977 | Chiapparoli | 377/48 |
| 4,053,739 | 10/1977 | Miller et al. | 377/47 |
| 4,101,838 | 7/1978 | Aihaha et al. | 331/51 |
| 4,184,068 | 1/1980 | Washburn | 377/47 |
| 4,316,151 | 2/1982 | Ooms | 328/14 |
| 4,423,381 | 12/1983 | Stepp et al. | 328/14 |
| 4,555,793 | 11/1985 | Benamy | 377/49 |

Primary Examiner—John S. Heyman
Attorney, Agent, or Firm—Sheldon Kanars; Jeremiah G. Murray; Maurice W. Ryan

[57] ABSTRACT

The digital frequency divider (or synthesizer) produces non-integral submultiples of an input frequency by alternately dividing its input by two integers by means of two integral digital frequency dividers, one of which produces an output higher than the desired non-integral submultiple and the other of which produces an output lower than the desired non-integral submultiple. The desired non-integral submultiple is obtained by alternately switching the circuit output to two integral digital dividers, the duty cycle of the switch determines the precise output frequency obtained. The concept can be implemented with programmable digital counters and logic circuitry. The circuitry can be used to implement a novel method of duplicating an accurate signal with improved stability. A circuit useful in practicing the method measures the ratio of two frequencies. The frequency divider can be used in a multiplexer set to provide an improved digital clock generator and asynchronous buffer which provides improved user clock signals.

11 Claims, 5 Drawing Figures

DIGITAL FREQUENCY DIVIDER OR SYNTHESIZER AND APPLICATIONS THEREOF

The invention described herein may be manufactured, used, and licensed by or for the Government for governmental purposes without the payment to me of any royalties thereon.

BACKGROUND OF THE INVENTION

A prior art means for generating a noise-free signal which is locked in frequency and phase to the fundamental, a harmonic, or sub-harmonic of an input reference signal, which may be noisy, in the phase locked loop (PLL). Such circuits can function as frequency dividers if a subharmonic of the input frequency is chosen and can function as a frequency synthesizer if the circuitry is capable of selecting numerous different harmonics or subharmonics of the input frequency. These prior art PLLs have certain disadvantages, for example, they cannot function without the continuous application of the input frequency, and they are of an analog nature comprising a variable voltage controlled oscillator connected in a feedback loop which includes RC circuits. This circuitry with its inherent RC time constant means that the output frequency cannot instantly follow changes in the input frequency. Another disadvantage of these PLLs is that they are only capable of generating integral harmonics or sub-harmonics of the input frequency. One aspect of the present invention comprises a digital frequency divider or synthesizer which does not have these disadvantages.

One application of the present invention is to provide a digital tracking clock generator for an asynchronous multiplexer set, for example, the US Army's AN/GSC-24. This multiplexer set presently comprises equipment which is capable of providing asynchronous time division multiplexing and demultiplexing capabilities for a digital transmission network. The multiplexing function accepts up to 15 channels of source data at various different low rates and interleaves them into a single high speed data stream. After transmission, the demultiplexer separtes the high speed digital stream into 15 different user channels and applies each channel of data to its user data modem at the lower rate. To accommodate non-synchronous channels which may have somewhat different timing sources, this multiplexer set uses a technique known as "bit stuffing" and "bit de-stuffing". The composite high speed digital bit stream has a percentage of its time slots devoted to "overhead", which is used for synchronizing purposes as well as to compensate for changes in user data rates, which may vary over or under the multiplexer internal timing or clock. Thus if the number of bits per frame allotted to a given channel is not sufficient to transmit all of the bits arriving from that user during that frame, the extra bits are transmitted as stuffing bits during the overhead portion of the frame, and conversely if the input channel generates fewer bits than are allotted to it, a delete bit or bits are inserted in the overhead. The action taken on the demultiplexing side of the AN/GSC-24 to accommodate this overhead servicing is referred to as "bit de-stuffing", followed by "smoothing". Thus any extra overhead bits are inserted in the proper user's data stream and his clock rate automatically adjusted to take care of the extra bit. A delete bit in the overhead results in the deletion of a given bit and the smoothing of the user's clock rate to match that of the source input. The stuffing and delete operations result in the smoothing of the individual channel output data and clock rates or frequencies. The present design of this equipment includes an analog PLL of the type described above in each of the demultiplexer channel cards. These PLLs slew the channel output data/clock up or down in frequency in accordance with the stuff/de-stuff commands. This increase or decrease in the output of one bit time is accomplished over an extended number of clock periods. The smoothing buffer is presently designed so that this one bit correction must be accomplished in a time period of no more than approximately 2000 bit times. Such a slew rate exceeds the synchronization capabilities of certain user modems connected to this multiplexer set. These interoperability problems of the AN/GSC-24 with these user modems can be eliminated with the use of an asynchronous storage buffer controlled by a digital tracking clock generator, which is another aspect of the present invention. This digital tracking clock generator is a device that has as its input any timing signal and has an output which is the average of the input frequency. The advantage of such a circuit is that momentary changes in input, causes for example by stuffing and destuffing of the channel clock, may be averaged over a long period of time. This capability enables the tracking generator to recreate at the user's modem the channel clock that originated at the transmit modem and thus provides a high order of immunity to changes introduced by the multiplexer's stuffing and de-stuffing action.

The tracking clock generator uses the concepts of the digital frequency divider/synthesizer which is part of this invention.

SUMMARY OF THE INVENTION

The digital frequency divider/synthesizer of this invention can produce an infinite number of output frequencies which can be any non-integral sub-multiple of the input frequency to be divided. The basic concept involves dividing the input frequency sequentially by two integers which differ by unity, to obtain an average or mean output frequency which falls anywhere between the two consecutive integral submultiples of the input frequency. The relative time during which each of the two paralleled, integral, digital frequency dividers are operating (or connected to the output) determines the average output frequency. The frequency jitter in the output caused by the frequency shifting between the two dividers can be made neglibible by dividing the input frequency by large integers, differing by one, to reduce the percentage difference in the two output frequencies.

Thus when used as a frequency divider the circuitry would for practical purposes be restricted to applications where frequency division is to be large, e.g., by a factor of 100 or more. The concept can be utilized as a variable, digital frequency generator or synthesizer and in such an application a wide range of output frequencies can be generated with low jitter by selecting the input frequency to be much greater than the highest desired output frequency.

The relative duty cycles of the two integral frequency dividers can be calculated from a simple formula, to yield any given desired output frequency. Novel circuitry is disclosed for achieving any desired duty cycle and hence any output frequency.

Such a frequency synthesizer can be calibrated against a highly accurate, but not necessarily stable, frequency source and then the stable local oscillator which forms the input to the synthesizer will produce an output which is both stable and accurate. This calibration involves simply comparing the frequency of the stable local oscillator (SLO) to the more accurate reference signal which is to be duplicated with the stability of the SLO. The calibration yields information which is used to program the relative times of operation, or duty cycles, of the two digital dividers which comprise the synthesizer. Thus the invention also comprises a method for obtaining such a duplicated signal with increased stability.

The digital tracking clock generator of the present invention includes such an SLO which is calibrated against the multiplexer's master clock to yield a channel clock equal to the average frequency of the master clock. This digital tracking clock generator is connected to an asynchronous channel buffer in such a way that the clock generator output is smoothed in response to the aforementioned stuffing/de-stuffing action of the multiplexer.

It is thus an object of this invention to provide a digital frequency divider capable of yielding any non-integral submultiple of an input frequency.

Another object of the invention is to provide a digital frequency synthesizer which produces output frequencies by alternately dividing the output frequency of a local oscillator by a pair of consecutive integers by means of a pair of digital integral frequency dividers to yield an output frequency which is a non-integral submultiple of the frequency of the local oscillator.

Another object of the invention is to provide a frequency synthesizer which can be calibrated against a reference signal and thereafter can reproduce said reference signal with extreme accuracy and stability using only a local oscillator of high stability but low accuracy.

A still further object of the invention is to provide a digital frequency divider/synthesizer which can be programmed to produce any non-integral sub-multiple of an input frequency.

Another object is to provide a circuit for measuring the ratio of two frequencies.

A further object of the invention is to provide a tracking clock generator for a multiplexer set which can be programmed to produce any desired user clock signal and which can be connected to a user storage buffer by means of a feedback system so that the said user clock signals will be smoothed to accommodate the insertion or deletion of stuffing or de-stuffing bits in the data stream processed by said multiplexer set.

These and other objects and advantages of the invention will become apparent from the following detailed description and the drawings.

DETAILED DESCRIPTION OF PREFERRED EMBODIMENTS

Figure 1:
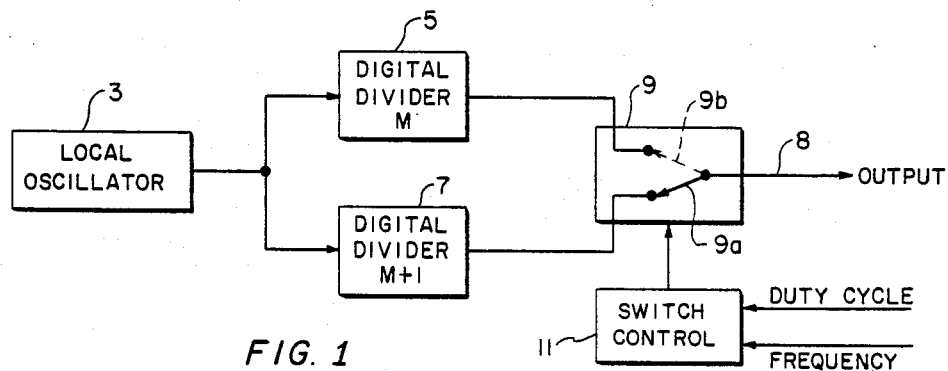
FIGS. 1 and 2 are circuits embodying concepts of the digital non-integral frequency divider or synthesizer.

FIG. 1 is a simplified block diagram which illustrates the mode of operation of the frequency divider or synthesizer of the present invention. The local oscillator 3 comprises the input signal and this signal would be the signal to be divided if the circuit is used as a frequency divider and it would be the reference or stable local oscillator (SLO) if the circuitry is used as a frequency generator or synthesizer. The output of local oscillator 3 is applied in parallel to a pair of integral digital frequency dividers, 5 and 7. These dividers may comprise counter type dividers which may be programmable so that they can be easily adjusted to produce any integral frequency ratio between the inputs and outputs thereof. The outputs of the dividers 5 and 7 are applied to a switch 9, which preferably would be a electronic switch capable of alternately connecting the outputs of each of the dividers 5 and 7 to output lead 8. The switch has only one pole, the solid line pole 9a being shown connected to the output of divider 7 and the dashed line pole 9b indicating the alternate connection to the output of divider 5. The switch control circuit 11 operates and controls the switch 9 and it can be programmed to any desired switch frequency and duty cycle, as indicated by the inputs so labelled. The two dividers 5 and 7 are programmed or constructed to provide frequency division by consecutive integers. The symbol M applied to divider 5 in FIG. 1 indicates the integral frequency division provided by this circuit and similarly the symbol M' indicates the frequency division provided by divider 7. Thus, for example, M may be 500 and M+1, 501. If local oscillator 3 has a frequency of, for example, 100. MHz, the output frequency at lead 8 could be anything between 200. kHz and 199.6008 kHz, depending on the relative times during which each of the frequency dividers 5 and 7 are connected to the output 8 via switch 9. These relative times are determined by the duty cycle of switch 9. A duty cycle which results in the switch 9 being connected to divider 5 for a large percentage of the time would result in an average output frequency close to the output of this divider, and likewise a duty cycle favoring divider 7 would result in an output frequency close to that of divider 7. As stated above, by making M large the frequency jitter in the output can be minimized. For most applications, M should be made at least 100. In certain applications where lower jitter is required, M may be required to be 500 or more.

Simple formulas can be used to relate the desired output frequency of the circuit of FIG. 1 to the duty cycle of the switch 9. Assuming that it is desired to divide the frequency of the local oscillator 3 by a non-integral factor, M.k. It is obvious that this decimal is always greater than M and less than M+1, so there exists some combination of frequency divisions by M and M+1 which will yield a division by M·k with in a small interval of time. The number of times that we divide by M and M+1 may be derived from k, however it is more helpful if these two numbers are expressed as $Y_1$ and $Y_2$, where $Y_1$ is the number of times we divide by M and $Y_2$ the number of times we divide by M+1. The ratio of $Y_1$ to $Y_2$ is given by the following equation:

$$Y_1/Y_2 = 1/k - 1 \qquad (1)$$

Figure 2:
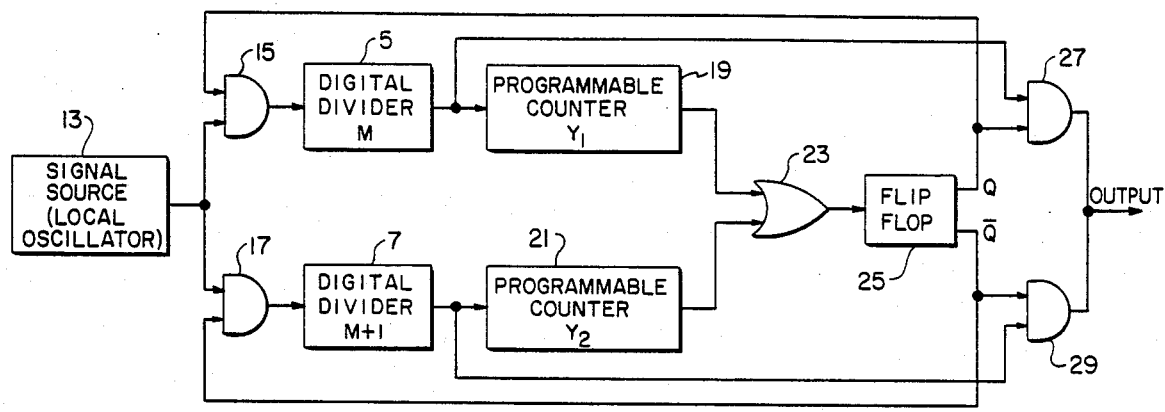

FIG. 2 is a circuit which includes a pair of digital frequency dividers which can be set to any values of M and M+1 and also includes circuitry which can be set for any values of $Y_1$ and $Y_2$ to yield any desired output from any given input signal source 13. This circuitry comprises a signal source 13 which may be a stable local oscillator, the frequency of which is to be divided. The output of 13 forms one input of each of two AND gates 15 and 17. The output of gate 15 is applied to digital divider 5, which is set to divide its input by the integer M. The output of gate 17 is applied to digital divider 7, which is set to divide its input by M+1. The output of divider 7 is applied to programmable counter 21 and also to one input of AND gate 29. Similarly, the output of divider 5 is applied to programmable counter 19 and to one input of AND gate 27. Divider 5 is similar to divider 7 but is programmed to divide its input by the integer M. The outputs of counters 19 and 21 form the two inputs of OR gate 23, the output of which is connected to the input of bi-stable flip-flop 25. The output $\overline{Q}$ of flip-flop 25 forms the second input of both of the AND gates 17 and 29, and similarly the other flip-flop output, Q, forms the second input of both the gates 15 and 27. The outputs of AND gates 27 and 29 are tied together to form the circuit output on which the divided frequency appears. The dividers 5 and 7 are settable to M and M+1 and both of these dividers may comprise digital counters that can be programmed to reset and produce an output pulse for any number of input pulses, after which the cycle repeats. The programmable counters 19 and 21 can be identical to the dividers 5 and 7, but these counters are set or programmed to produce a pulse output after $Y_1$ and $Y_2$ input pulses, respectively, or $Y_1$ and $Y_2$ multiplied by some power of 10, as explained below, have been accumulated from the dividers 5 and 7. Thus, after counter 19 has reached $Y_1$ counts, it will apply an output pulse to flip-flop 25 through OR gate 23. Flip-flop 25 wil change state and its output $\overline{Q}$ is applied to AND gate 17 which will switch the signal source 13 to divider 7 which will then start to accumulate counts on counter 21. When counter 21 reaches $Y_2$ counts, the flip-flop 25 will again change state and divider 5 and its counter, 19, will again become operative. The settings M, M+1, $Y_1$ and $Y_2$ of the dividers and the counters are derived from the formula (1) and from the known frequency of source 13 and the desired output frequency. For example the frequency of source 13 divided by the desired output frequency is M.k. The ratio $Y_1/Y_2$ obtained from equation (1) will usually be a number less than 10 and often will be a decimal number. Thus it is convenient to obtain $Y_1$ in terms of $Y_2$ or vice versa, and to eliminate the decimal by multiplying by an appropriate power of 10. For example, if $Y_1/Y_2=1.314$, then $Y_1=Y_2 \cdot 1.314$ and $1,000 Y_2 = 1,314 Y_1$. Thus the counter 19 would be set to 1314 and counter 21 to 1,000, to yield the proper ratio of the outputs of the dividers 5 and 7. It should be noted that the quantities $Y_1$ and $Y_2$ define the duty cycle for use in the circuit of FIG. 1, for example, if $Y_2/Y_1=2.0$, then the duty cycle of switch 9 would be adjusted so that switch 9 is connected to divider 7 for twice as long as it is connected to divider 5.

For digital data transmission applications such as in the aforementioned AN/GSC-24, where jitter must be minimized, allowing the counters 19 and 21 to continuously accumulate a large number of counts before switching to the other frequency divider would result in unacceptably high jitter. The same output frequency accuracy can be achieved with lower jitter by switching back and forth between the two frequency dividers more often but with a more complex algorithm. For example if $Y_1 = 2.12 Y_2$, the algorithm could be as follows: For nine cycles, $Y_1$ would be 1 and $Y_2$ would be 2, on the tenth cycle $Y_1$ would be 1 and $Y_2$ would be 3; this pattern will repeat up to the 90th cycle, after which $Y_1$ will continue to be 1 until the 100th and last cycle in the algorithm. For cycles 91-97, inclusive, $Y_2=2$, and for cycles 98-100, inclusive, $Y_2=3$. This sequence or algorithm yields the desired ratio of 100 to 212 for $Y_1/Y_2$ and thus yields the desired average frequency with low jitter. With this algorithm $Y_1$ is always 1 but $Y_2$ varies to achieve the desired ratio of $Y_1$ to $Y_2$.

In practice all of the counters of FIG. 2 are programmable binary or decimal counters and are capable of being pre-loaded so that they can divide by any programmed integer. In order to achieve synchronization, the same load signal can be applied to both counters 5 and 7 with a separate but synchronized load signal applied to counters 19 and 21.

Figure 3:
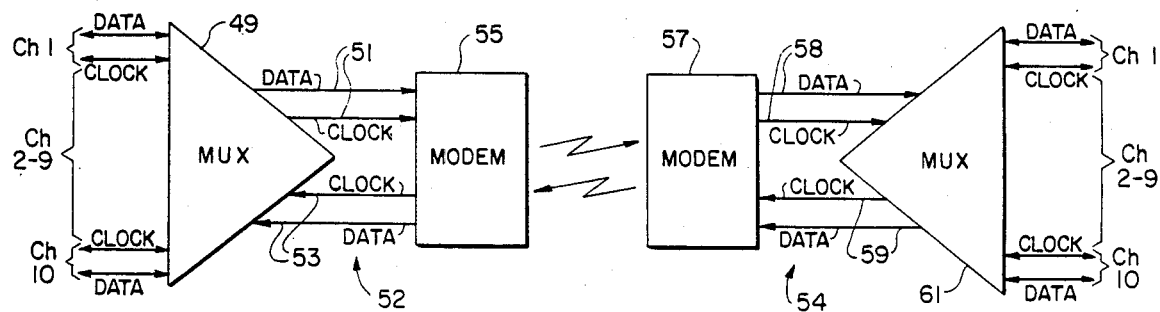
FIG. 3 is a prior art multiplexer set to which the invention is applicable.

FIG. 3 is a simplified block diagram of a multiplexer (MUX) set similar to the aforementioned AN/GSC-24, but having only a 10 channel (or 10 user) capability. The system comprises two identical terminals, 52 and 54. Terminal 52 comprises a multiplexer (MUX) 49, having the 10 user channel duplex data and clock lines connected thereto, as shown. The MUX 49 time division multiplexes the 10 incoming data channels into one outgoing high speed data stream with its own clock, and with the aforementioned overhead time slots in each frame. This outgoing high speed stream is indicated by data and clock lines 51. The modem 55 modulates onto a carrier the signals on lines 51 for transmission to the remote terminal 54. The modem 55 also demodulates the incoming high speed data received from terminal 54 and applies it to the MUX 49 via leads 54. This incoming data is then de-multiplexed and fed to the appropriate users. The second terminal, 54, comprises modem 57, MUX 61, incoming data and clock 58 and outgoing data and clock 59. This terminal operates in the same way as terminal 52.

Figure 5:
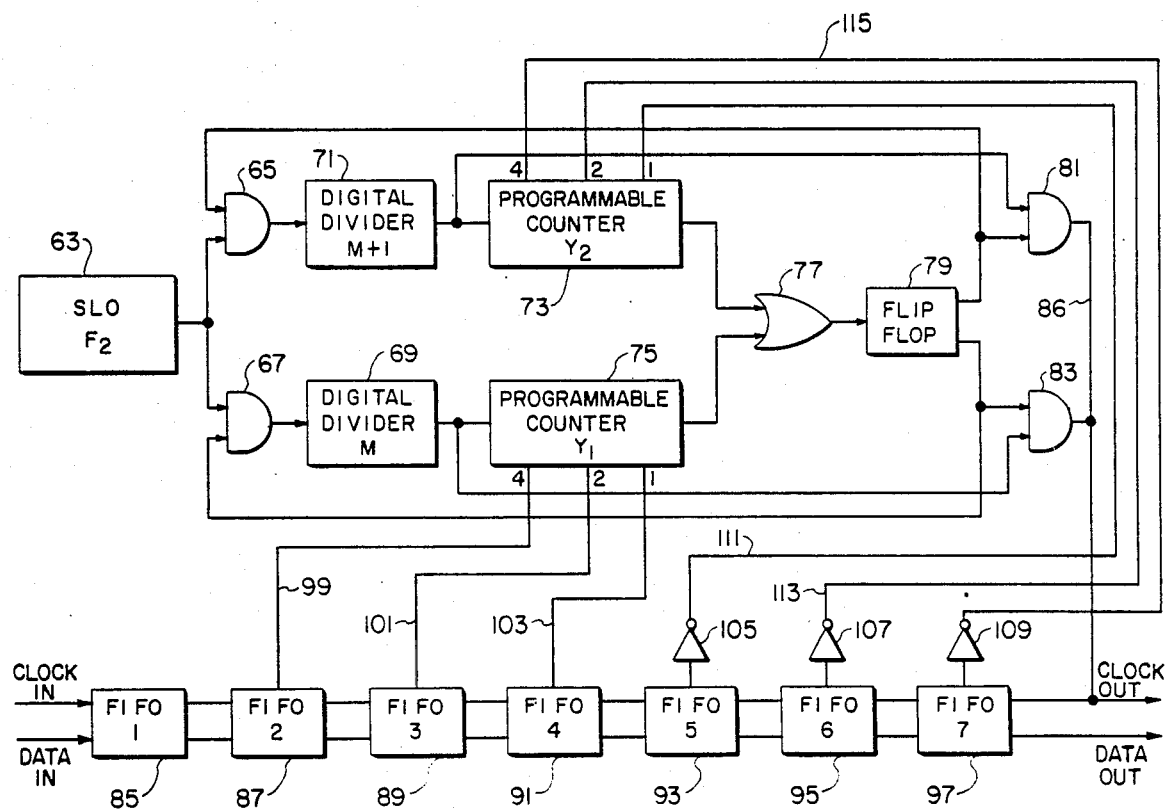
FIG. 5 is a digital tracking clock generator and buffer which is useful in a multiplexer such as that of FIG. 3.

The interoperability difficulties of the AN/GSC-24 mentioned above, due to the use of a conventional PLL therein, can be eliminated by the use therein of an asynchronous storage buffer with a digital tracking clock generator between the units. Such a buffer and clock generator is shown in FIG. 5. An asynchronous buffer is a storage device which allows data to be written in and read out from its arrays at different and independent rates. It is composed of cascaded FIFO (first in-first out) units. Data bits are fed to the input end of the FIFO array and are fed out at the other end. If the output end clock is running slower than the input end clock, bits will accumulate in the FIFO storage units. Speeding up the output rate or slowing down the input rate or clock will cause the buffer to be emptied out by the faster output clock. The advantage of such a buffer is that momentary changes in the input, such as results from the stuffing/de-stuffing of the AN/GSC-24 channel clock, may be averaged over a long period of time, and thus the tracking clock generator connected thereto can be increased or decreased by the smallest increments. Thus the tracking clock generator recreates at the receive modem the same channel clock that originated at the transmit modem, to thus provide a high order of immunity from changes causes by the MUS stuffing/de-stuffing action.

Figure 4:
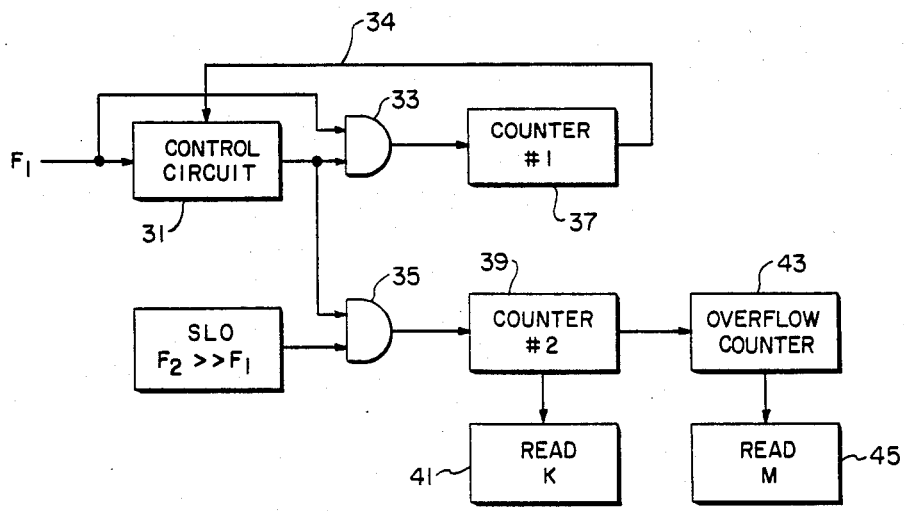
FIG. 4 is a circuit for measuring the ratio of two frequencies.

The purpose of the tracking clock generator is to provide the receive modem with a clock equal to the source or transmit clock in rate and stability. This is accomplished by generating a clock equal to the long term average AN/GSC-24 clock, thus smoothing and eliminating short term variations caused by the stuffing/de-stuffing action. The generation of this clock equal to the source clock in rate and stability is accomplished by frequency divison by means of techniques embodying the concepts of the circuits of FIGS. 1 and 2. The desired clock frequency is obtained by dividing the frequency, $F_2$, of a very high frequency stable local oscillator (SLO). The diagram of FIG. 4 shows circuitry by means of which the frequency, $F_1$, of an internal MUX channel clock can be averaged and compared in frequency to a higher frequency SLO at frequency $F_2$ to yield the parameters $M_1 Y_1 + Y_2$ for adjustment of the frequency divider which forms part of the tracking clock generator of FIG. 5. Since the MUX channel clock at $F_1$ has high accuracy but is not stable, the divided frequency of the SLO will be both stable and accurate, thus this circuitry can be used to practice the aforementioned method.

In FIG. 4, the internal MUX clock at frequency $F_1$ is applied to control circuit 31 and to one input of AND gate 33, the other input of which is the output of circuit 31. The stable local oscillator at $F_2$, which is much larger than $F_1$ forms one input of AND gate 35, the other input of which is the output of control circuit 31. Counter #1,37, which contains N decimal stages has as its input the output of gate 33 and has its output connected to control circuit 31. The decimal counter #2, 39, has the same number of stages or digits, N, as does counter #1, and has its output connected to the input of overflow counter 43. The read circuits 41 and 45 are connected to the counters 39 and 43, as shown, and are adapted to read these counters. Initially all counters are reset to zero and the signals $F_1$ and $F_2$ applied as shown. The control circuit 31 is a transmission gate which will allow the signal $F_1$ to pass through to gate 33 as long as there is no signal on lead 34 from counter #1. When counter #1 reaches its capacity of $10^N$ counts, a signal on lead 34 closes control circuit 31 and thus stops all three counters. During this counting period the high frequency SLO signal $F_2$ has been applied to the counter #2 (39) and to overflow counter 43. The overflow counter 43 indicates the number of times that counter 39 has cycled while counter #1 (37) has cycled once. Thus the reading on counter 43 is equal to the previously defined integer M. The remainder factor k is represented by the reading on counter 39. Thus with these two quantities the settings $M, M+1$, $Y_1$ and $Y_2$ required to adjust a circuit such as FIG. 2 to achieve the desired frequency division have been obtained. The figures obtained will represent the average frequency during which the counters were operating, and by selecting counters 37 and 39 to have a large number of stages, or a large N, the averaging time can be made any desired length.

The tracking clock generator and the asynchronous buffer of FIG. 5 comprises a digital frequency divider similar to that of FIG. 2, with the stable local oscillator 63 at frequency $F_2$, connected to the divider input. The asynchronous smoothing buffer comprises an array of cascaded FIFO storage devices, 85, 87, 89, 91, 93, 95, and 97. The user data and clock signals are applied to the left end of the FIFO array from the MUX and this input clock and data will vary in rate as a result of stuffing and de-stuffing. The output clock and data stream at the right end of the cascaded FIFO array will be at the rate of the divided output of SLO 63, smoothed by means of a feedback system which senses the condition of the FIFO stages to determine whether any temporary increase or decrease in the output clock and data rates is required to achieve smoothing. The clock and data output stream is fed to the appropriate user, as illustrated by the channel pairs 1-10 in FIG. 3.

The digital frequency divider of FIG. 5 comprises SLO 63 connected to one input of each of the AND gates 65 and 67. Gate 65 has its output applied to digital divider 71, which divides its input by the integer $M+1$ and has its output connected to programmable counter 73, which is programmed to produce one count after $Y_2$ input pulses have been received from counter 71. The output of counter 71 also forms one input of AND gate 81. Similarly the digital divider 69 divides its input by M and has its output connected to programmable counter 75 which produces one output pulse for each $Y_1$ input pulses. Both of the counters 73 and 75 have their outputs connected to OR gate 77, as shown, the output of which controls flip-flop 79. It can be seen that the circuitry so far described is the same as that of FIG. 2, and it functions in the same way to divide the frequency, $F_2$, of SLO 63 to yield a divided frequency output at the tied-together outputs 86 of AND gates 81 and 83, which output frequency is equal to the average of the MUX clock signal $F_1$ which was applied to the circuit of FIG. 4 to yield the parameters M, $Y_1$ and $Y_2$ used to adjust the counters of FIG. 5.

The programmable counters 73 and 75, in addition to being programmable so that they can be set to produce outputs after $Y_2$ and $Y_1$ input pulses, respectively, are tied into the asynchronous storage buffer comprising the cascaded FIFOs in such a way that the settings, $Y_1$ and $Y_2$ of these counters can be changed slightly in accordance with the amount of data in the buffer, to achieve smoothing by slightly increasing or decreasing the frequency of the divider output on lead 86 which forms the user clock at the output of the buffer. The buffer comprises seven FIFO storage devices, 85, 87, 89, 91, 95, and 97, cascaded as shown. The three stages 87, 89, and 91 are connected to counter 75 via leads 99, 101, and 103. Data in any of these stages will produce a signal on these leads connected to counter 75 and such signal will alter the setting $Y_1$ thereof by increasing it. The signal on lead 103 is arranged to increment the least significant bit of the binary number $Y_1$, indicated by the numeral 1 at the connection of lead 103 to counter 75. Similarly a signal on lead 101 indicative of data in buffer stage 89 will increment the next more significant bit of $Y_1$, indicated by digit 2. Also data in buffer stage 87 will produce a signal on lead 99 which will increment the binary digit of $Y_1$ which has a value of 4. Thus $Y_1$ is incremented if the buffer is nearing its capacity caused by the insertion therein of a large number of stuffing bits. With $Y_1$ incremented, the divider will spend a greater percentage of its time dividing by the lower factor M, thus resulting in a higher output frequency on lead 86. This higher output clock cranks the stored data out of the buffer faster to prevent overloading.

The last three FIFO stages 93, 95, and 97 are similarly arranged to alter the setting $Y_2$ of counter 73 by incrementing $Y_2$ in the event that the last three stages are empty, indicating that the output clock rate at lead 86 should be reduced to accomodate the insertion of delete bits in the user's data stream. Inverters 105, 107, 109 are connected between the FIFO stages 93, 95, and 97, respectively and the three control inputs 1, 2, and 4 of counter 73, via leads 111, 113, and 115. The lack of a data bit in stage 93 will produce an output from inverter 105 which will apply this signal to the least significant control input (1) of counter 73 and thus increment $Y_2$ by one binary digit. Similarly, the lack of a signal in FIFO stage 97 will increment $Y_2$ by four binary digits. This incrementing of $Y_2$ will increase the time during which the divider 71 is operating and temporarily reduce the output clock rate at lead 86, until the three FIFO stages 93, 95 and 97 are again filled with data.

While the invention has been described in connection with illustrative embodiments, obvious variations therein will occur to those skilled in the art, accordingly the invention should be limited only by the scope of the appended claims.

What is claimed is:

1. A digital frequency divider or synthesizer comprising a pair of integral digital frequency dividers having the inputs thereof connected to a local oscillator, the frequency of which is to be divided by a noninteger, M·k, one of said digital dividers being programmed to divide the output of said local oscillator by M and the other of said digital dividers being programmed to divide the output of said local oscillator by M+1, and switching and synchronizing means alternately connecting the outputs of said frequency dividers to an output lead for synchronously switching said pair of digital frequency dividers at the trailing edge of their respective pulse train outputs, the duty cycle of said switching means being selected to yield the desired nonintegral frequency division.

2. A circuit for producing an output comprising a nonintegral frequency division (or submultiple) of a local oscillator, comprising, in combination, two integral digital frequency dividers having their inputs connected to said local oscillator, one of said integral frequency dividers producing a divided output frequency greater than the desired nonintegral output frequency and the other of said integral frequency dividers producing an output frequency less than the desired nonintegral output, and switching and synchronizing means connecting the outputs of said two integral frequency dividers to said output for synchronously switching said two digital frequency dividers at the trailing edges of their respective pulse train outputs, said switching means having a duty cycle arranged to produce said desired nonintegral frequency division by selection of the time during which each of the outputs of said integral digital frequency dividers is connected to said output.

3. A circuit for producing a non-integral sub-multiple of the frequency of a local oscillator or other signal source, comprising; a local oscillator having its output alternately connected to the inputs of a pair of programmable digital frequency dividers, the first of said digital frequency dividers being programmed to divide the output of said local oscillator by the integral factor M and the second of said digital frequency dividers being programmed to divide the output of said local oscillator by the factor M+1, wherein the desired non-integral sub-multiple factor is M·k, and wherein the output of said first digital frequency divider is applied to the input of a first programmable counter which is programmed to produce an output pulse for every $Y_1$ input pulses, or some multiple thereof, and the output of said second programmable counter which is programmed to produce an output pulse for every $Y_2$ input pulses, or some multiple thereof, and wherein both of said multiples are the same, and wherein $Y_1/Y_2 = 1/·k - 1$, and wherein circuit means are provided for switching the output of said local oscillator signal source from one of said digital frequency dividers to other each time that either of said counters reaches its programmed number of $Y_1$ or $Y_2$, and wherein the output of said circuit comprises the paralleled outputs of said first and second digital frequency dividers.

4. The circuit of claim 3 wherein M is at least 100.

5. The circuit of claim 4 wherein said circuit means comprises two AND gates each having its output connected to the input of a separate one of said first and second digital frequency dividers, one of the inputs of each of said AND gates being the output of said local oscillator and the other input of each being a different one of the outputs of a flip-flop circuit, the input of said flip-flop being connected to the outputs of each of said programmable counters via an OR gate.

6. A circuit for producing an output comprising a non-integral frequency division (or sub-multiple) of the frequency of a local oscillator, comprising; two integral frequency dividers having frequency division ratios which differ by unity, one of said integral frequency dividers producing a divided output frequency greater than the desired non-integral output frequency and the other of said integral frequency dividers producing an output frequency less than the desired non-integral output frequency, the outputs of said integral frequency dividers connected to programmable counters, the outputs of said counters connected to switching means for switching the output of said local oscillator to one or the other of said integral frequency dividers, the duty cycle of said switching means being selected to yield said non-integral sub-multiple of the frequency of said local oscillator, and wherein the outputs of said integral frequency dividers are tied together to form the circuit output.

7. A circuit for comparing the frequency of one frequency source, $F_1$, to another frequency source, $F_2$, much higher than $F_1$, comprising, first and second digital counters having an equal number of stages, an overflow digital counter connected to the output of said second digital counter, a first read circuit connected to said second digital counter, and a second read circuit connected to said overflow counter, circuit means to apply said frequency $F_1$ to said first digital counter and to simultaneously apply said frequency $F_2$ to said second digital counter until the said first digital counter reaches its capacity, after which all three counters are automatically stopped, whereby the reading on said read circuits indicate the ratio of the two said frequency sources.

8. The circuit of claim 7 wherein said circuit means comprises a transmission gate controlling the application of said signal sources at $F_1$ and $F_2$ to said digital counters, said transmission gate being automatically shut off when said first digital counter reaches its capacity.

9. A digital tracking generator and an asynchronous channel buffer for use in a multiplexer set for producing user clock signals, said digital tracking clock generator comprising a stable local oscillator having a frequency at least 100 times that of said user clock signals, said stable local oscillator connected to the input of a non-integral digital frequency divider which comprises two integral digital frequency dividers the first of which produces an output frequency greater than said user clock frequency and the second one of which produces an output frequency less than the said user clock frequency, means to alternately connect said stable local oscillator to said two integral frequency dividers, first and second programmable counters connected respectively to the outputs of said first and second integral frequency dividers, the outputs of said programmable counters being arranged to control the relative times during which the two said integral frequency dividers are connected to the output of said stable local oscillator, the outputs of said two integral frequency dividers being tied together to form the said user clock signal, the said asynchronous buffer comprising a plurality of cascaded first-in, first out memory stages, the input of which are unsmoothed channel clock and data signals from said multiplexer, circuit means to sense the state of the signals in the stages of said buffer and means to alter the program of said programmable counters in response thereof, whereby said user clock signals will be smoothed.

10. The circuit of claim 9 wherein said circuit means speed up said user clock if said buffer is approaching its data capacity and slows down said user clock if said buffer has little data therein.

11. A method of reproducing an accurate low frequency (first) signal with enhanced stability, without the use of a phase-locked loop, comprising the steps of
producing a ratio signal by comparing said accurate, low frequency (first) signal to another high frequency (second) signal having a higher stability than said accurate low frequency (first) signal,
programming a frequency divider to divide an input thereto by said ratio signal, and then
applying said high-frequency signal to the input of said frequency divider,
whereby the output of said frequency divider will be at the frequency of said accurate (first) signal with the enhanced stability of said stable signal.

* * * * *